United States Patent
Park et al.

(10) Patent No.: US 7,515,662 B2
(45) Date of Patent: Apr. 7, 2009

(54) METHOD FOR COMPENSATING FOR GAIN RIPPLE AND GROUP DELAY CHARACTERISTICS OF FILTER AND RECEIVING CIRCUIT EMBODYING THE SAME

(75) Inventors: Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 66 days.

(21) Appl. No.: 11/708,702

(22) Filed: Feb. 21, 2007

(65) Prior Publication Data
US 2007/0204315 A1    Aug. 30, 2007

(30) Foreign Application Priority Data
Feb. 23, 2006    (KR) .................... 10-2006-0017516

(51) Int. Cl.
*H04B 1/06*    (2006.01)

(52) U.S. Cl. .................. 375/350; 455/307; 708/300; 725/100; 725/131; 725/151; 348/731

(58) Field of Classification Search .............. 375/350; 725/100, 131, 151; 348/731; 455/307; 708/300
See application file for complete search history.

(56) References Cited

U.S. PATENT DOCUMENTS

| | | | | |
|---|---|---|---|---|
| 5,949,821 A | * | 9/1999 | Emami et al. | 375/235 |
| 6,934,346 B2 | * | 8/2005 | Lindoff et al. | 375/349 |
| 7,286,804 B2 | * | 10/2007 | Miyagi et al. | 455/169.1 |
| 2004/0087296 A1 | * | 5/2004 | Park et al. | 455/285 |
| 2005/0260949 A1 | * | 11/2005 | Kiss et al. | 455/67.14 |
| 2007/0202825 A1 | * | 8/2007 | Park et al. | 455/226.1 |

* cited by examiner

*Primary Examiner*—Shuwang Liu
*Assistant Examiner*—Helene Tayong

(57) ABSTRACT

Embodiments of methods and apparatuses can compensate gain ripple and/or group delay characteristics of at least one filter, a receiving circuit embodying a filter, or a communication system having a wireless terminal embodying the receiving circuit.

17 Claims, 4 Drawing Sheets

METHOD FOR COMPENSATING FOR GAIN RIPPLE AND GROUP DELAY CHARACTERISTICS OF FILTER AND RECEIVING CIRCUIT EMBODYING THE SAME

BACKGROUND

1. Field

The present invention relates to apparatus, methods and receiving circuits for compensating for characteristics of a filter.

2. Background

In a receiving circuit of a terminal for a communication system, compensation of characteristics of a filter need to be provided. However, since characteristics of the filter vary across a range of frequencies, it can be difficult or costly (e.g., size, price, components and/or power consumption) to produce a filter that meets required characteristics.

SUMMARY OF THE INVENTION

Objects of embodiments of the invention are to provide apparatus, methods or receiving circuits for compensating for characteristics of a filter.

To achieve at least the above objects or following embodiments in whole or in part, there is provided a communication system, that can include a first terminal, a network coupled to the first terminal and a second terminal coupled to the network to receive a signal from the first terminal, wherein the second terminal has a receiving circuit that can include an IQ mixer configured to output a first signal obtained by combining a received signal with an in-phase signal and a second signal obtained by combining the received signal with a quadrature signal, a first filter configured to receive the test signal during a first period and the first signal during a second period, a second filter configured to receive the test signal during a first period and the second signal during a second period, a test signal generator configured to generate the test signal to detect at least one of a gain ripple characteristic and a group delay characteristic of a filter, a first ADC configured to receive an output signal from the first filter, a second ADC configured to receive an output signal from the second filter and a filter compensation circuit configured to receive output signals respectively from the first ADC and the second ADC to determine a coefficient during the first period and compensate for said at least one of a gain ripple characteristic and a group delay characteristic of the first filter and the second filter by operating according to the coefficient during the second period.

To achieve at least the above objects or following embodiments in whole or in part, there is provided a receiving circuit that can include an IQ mixer configured to output a first signal and a second signal, the first signal being obtained by multiplying a received signal to an in-phase signal, and the second signal being obtained by multiplying the received signal to a quadrature signal, a first filter configured to receive the first signal, a second filter configured to receive the second signal, a first ADC configured to receive an output signal of the first filter, a second ADC configured to receive an output signal of the second filter and a filter compensation circuit configured to receive an output signal of both the first ADC and the second ADC, wherein the filter compensation equalizer configured to compensate at least one of a gain ripple characteristic and a group delay characteristic of the first filter and the second filter by operating according to an equalizing coefficient.

To achieve at least the above objects or following embodiments in whole or in part, there is provided a method for compensating a filter of a receiving circuit that can include applying a test signal to the filter to determine a coefficient of an equalizer according to an output of the filter and applying an output of a down conversion IQ mixer to the filter while the equalizer compensates a corresponding digital signal converted from the output of the filter for at least one of a gain ripple characteristic and a group delay characteristic of the filter by operating according to the coefficient of the equalizer determined while applying the test signal.

BRIEF DESCRIPTION OF THE DRAWINGS

Embodiments will be described in detail with reference to the following drawings in which like reference numerals refer to like elements wherein.

DETAILED DESCRIPTION

Embodiments according to the invention will now be described with reference to the accompanied drawings. Interpretations of terms and wordings used in description and claims should not be limited to common or literal meanings. Embodiments are provided for those skilled in the art to more completely understand the invention.

Figure 1:
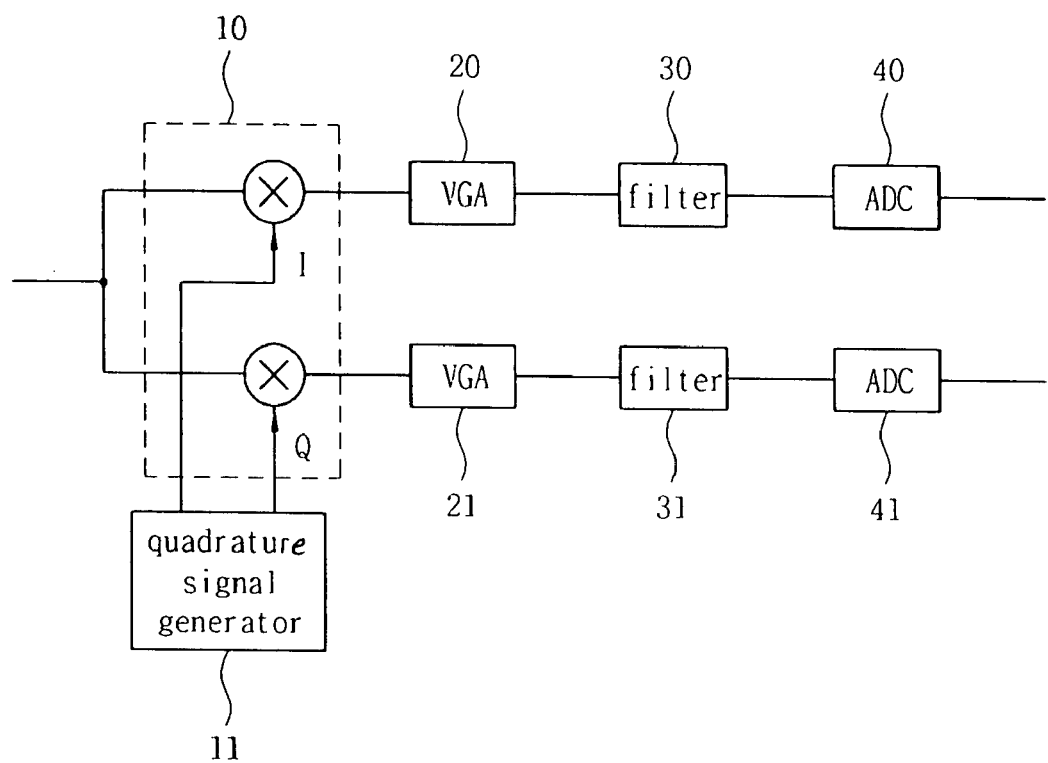
FIG. 1 is a diagram illustrating a related art receiving circuit.

FIG. 1 is a diagram illustrating a related art receiving circuit. As shown in FIG. 1, a receiving circuit includes an IQ mixer 10, a quadrature signal generator 11, first and second variable gain amplifiers 20 and 21, first and second band pass filters 30 and 31, and first and second analog to digital converters 40 and 41. The receiving circuit converts a received RF signal transmitted from an antenna (not shown) to a base band signal or an intermediate frequency signal, which is then converted to a digital signal to be outputted through a base band processing unit (not shown).

The first and the second band pass filters 30 and 31 included in the receiving circuit perform a function of passing through a band that is used in the subsequent base band processing unit. When the IQ mixer 10 converts the received RF signal to the base band, low pass filters can be used as the first and the second band pass filters 30 and 31. When the IQ mixer 10 converts the received RF signal to the intermediate frequency, band pass filters can be used as the first and the second band pass filters 30 and 31.

Figure 2:
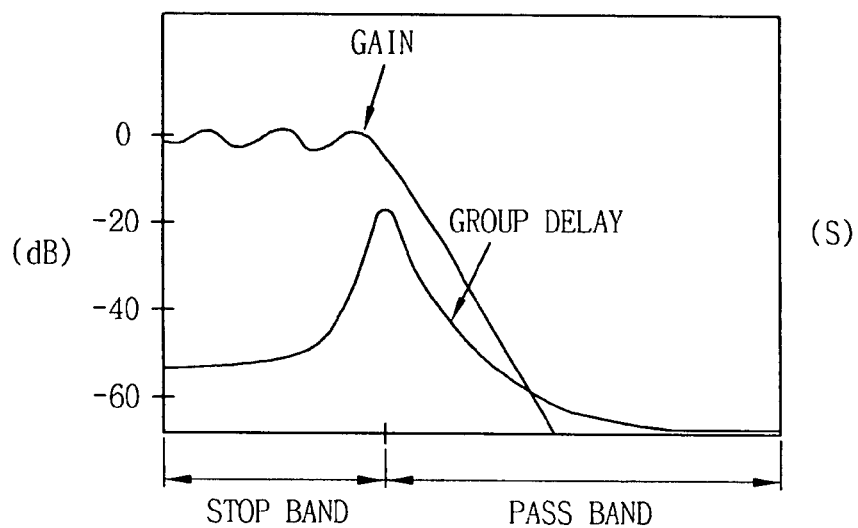
FIG. 2 is a diagram illustrating an example of a gain and a group delay characteristics of a low pass filter.

Gain and group delay characteristics of the filter are shown in FIG. 2 when the first and the second band pass filters 30 and 31 are the low pass filters. However, embodiments are not intended to be so limited thereby.

As shown in FIG. 2, since a gain is large in a pass band, and the gain is small in a stop band, the filter passes through a signal positioned in the pass band only. However, in case of a real filter, the gain is not the same for all frequencies in the pass band and varies or fluctuates up and down according to a variation of the frequency, for example, as shown in FIG. 2. Such characteristic of the filter is referred to as a ripple of the gain, and will be referred to as the gain ripple hereafter from time to time. In addition, the group delay is not the same for all frequencies in the pass band. Since the gain and group delay characteristics of the filter can distort the received signal, for example, the group delay characteristic can generate interference between received symbols, the gain and group delay characteristics of the filter should be reduced or limited to a predetermined range. However, in order to limit the gain and group delay characteristics of the filter to the predetermined range, a more expensive and complex filter should be used, and a power consumption also increases. Further, when the gain is required to have a steep slope at a boundary of the pass band because of a small width of the guard band positioned between two adjacent frequency bands, it is not facile to design a filter satisfying such gain characteristic and a limit in the ripple and the group delay.

Embodiments according to the present invention provide methods or receiving circuits for compensating for gain ripple and/or group delay characteristics of a filter where the gain ripple or group delay characteristics of the filter included in the receiving circuit can be compensated.

Figure 3:
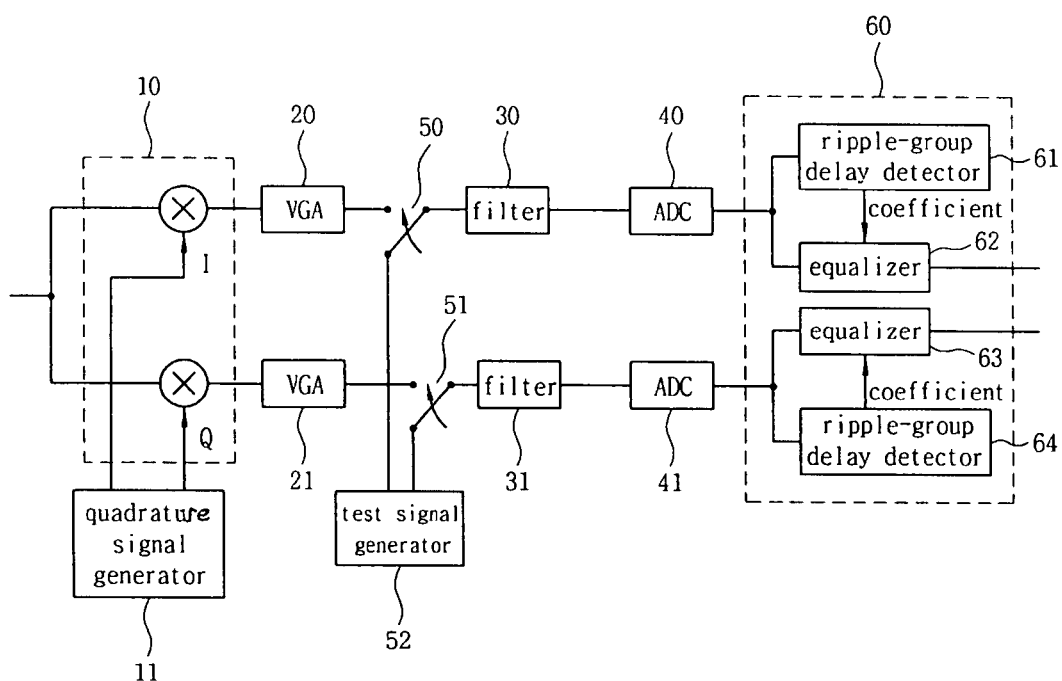
FIG. 3 is a diagram illustrating a receiving circuit configured to compensate for a gain ripple and a group delay characteristics of a filter in accordance with an embodiment of the invention.

FIG. 3 is a diagram illustrating a receiving circuit for compensating for a gain ripple and/or a group delay characteristics of a filter in accordance with an embodiment of the invention. As shown in FIG. 3, the receiving circuit can include an IQ mixer 10, a quadrature signal generator 11, first and second variable gain amplifiers 20 and 21, first and second switches 50 and 51, a test signal generator 52, first and second band pass filters 30 and 31, first and second analog to digital converters 40 and 41 and a filter compensation equalizer 60.

The IQ mixer 10 outputs a first signal that can be obtained by multiplying an input signal or a received signal to an in-phase signal I, and a second signal that can be obtained by multiplying the received signal to a quadrature signal Q. The IQ mixer 10 can be a down conversion mixer for converting the input signal, for example received RF signals, to a signal of a base band or an intermediate frequency. The received RF signal, which can be a RF signal transmitted from an antenna (not shown), may be transmitted to the IQ mixer 10 through a matching network (not shown) and a low noise amplifier (LNA, not shown), or through a duplexer (not shown) and the LNA. The quadrature signal generator 11 can output the in-phase signal I and the quadrature signal Q having a 90° phase difference therebetween. When the IQ mixer 10 converts the received RF signal to the signal of the base band, frequencies of the in-phase signal I and the quadrature signal Q can correspond to a carrier frequency of the received RF signal. When the IQ mixer 10 converts the received RF signal to the signal having the intermediate frequency, the frequencies of the in-phase signal I and the quadrature signal Q can correspond to a sum of the carrier frequency of the received RF signal and the intermediate frequency or a difference between the carrier frequency of the received RF signal and the intermediate frequency.

Thus, the first and the second signal outputted by the IQ mixer 10 may be base band signals. In addition, in case that a DC offset or a 1/f noise that may occur when an output of the IQ mixer 10 is the base band signal cause problems, the IQ mixer 10 may convert the received RF signal to the signal of the intermediate frequency to be outputted so that such problems may be reduced or avoided. In such case, the intermediate frequency may be selected considering processing capabilities of the first and the second analog to digital converters 40 and 41 and subsequent processing units. For example, the intermediate frequency may be a few times (e.g., multiple) of a width of the base band.

The first and the second variable gain amplifiers (VGA) 20 and 21 are a type of an amplifier that amplifies the first signal and the second signal. While the first and the second variable gain amplifiers 20 and 21 are between the IQ mixer 10 and the first and the second switches 50 and 51 as shown in FIG. 3, embodiments are not intended to be so limited. For example, the first and the second variable gain amplifiers 20 and 21 may be disposed between the first and the second switches 50 and 51 and the first and the second band pass filters 30 and 31, or between the first and the second band pass filters 30 and 31 and the first and the second analog to digital converters 40 and 41.

In another embodiment, the first and the second variable gain amplifiers 20 and 21 may also be omitted. In another exemplary embodiment, in addition to the first and the second variable gain amplifiers 20 and 21 shown in FIG. 3, the receiving circuit may include third and fourth variable gain amplifiers (not shown) between the first and the second band pass filters 30 and 31 and the first and the second analog to digital converters 40 and 41.

The first and the second switches 50 and 51 can transmit a test signal, for example, generated in the test signal generator 52 to the first and the second band pass filters 30 and 31 during a test period, and can transmit signals respectively output by the first and the second VGAs 20 and 21 to the first and the second band pass filters 30 and 31 during a normal operation period. The test signal can be a signal generated in order to detect gain ripple and/or group delay characteristics of the first and the second band pass filters 30 and 31. For instance, the test signal may include a signal having a frequency that is sequentially increased from a lowest frequency to a highest frequency of a pass band of the first and the second band pass filters 30 and 31 or a signal having a frequency that is sequentially decreased from the highest frequency to the lowest frequency of the pass band of the first and the second band pass filters 30 and 31. However, embodiments are not intended to be so limited as any signals sufficient to detect the gain ripple and/or group delay characteristics may be used.

The test signal generator 52 may be disposed in a receiver (not shown) of wireless communication terminal. In such case, the gain ripple and group delay characteristics of the first and the second band pass filters 30 and 31 may be measured whenever desired or whenever required such that a variation of the gain ripple and group delay characteristics according to a time lapse and a temperature of the first and the second band pass filters 30 and 31 may be appropriately reflected or compensated. However, embodiments are not intended to be so limited. For example, the test signal generator 52 may be a sweep function generator disposed outside the receiver of the wireless communication terminal. In such case, an equalizer coefficient can be determined by measuring the gain ripple and group delay characteristics during a manufacturing process, and the coefficient can be maintained during a use by a user.

The first filter and the second filter 30 and 31 may be a low pass filter, a band pass filter or the like. Generally, the low pass filter is used when the IQ mixer 10 converts the received RF signal to a base band signal, and the band pass filter is used when the IQ mixer 10 converts the received RF signal to an intermediate frequency signal. However, embodiments are not intended to be so limited. When the first and the second band pass filters 30 and 31 are the low pass filter, an example of the gain ripple and group delay characteristics is shown in FIG. 2.

The first and the second analog to digital converters 40 and 41 can convert signals outputted by the first and the second band pass filters 30 and 31 to digital signals.

The filter compensation equalizer 60 can obtain an equalizer coefficient from the signals outputted by the first and the second ADCs 40 and 41 during the test period, and can operate first and second equalizers 62 and 63 using the obtained equalizer coefficients during normal operations period to compensate for at least one of the gain ripple and the group delay characteristics generated because of the first and the second band pass filters 30 and 31. The filter compensation equalizer 60 may include first and second ripple-group delay detectors 61 and 64, and the first and the second equalizers 62 and 63. However, embodiments are not intended to be so limited thereby.

The first and the second ripple-group delay detectors 61 and 64 can measure the gain ripple and the group delay characteristics of the first and the second band pass filters 30 and 31 using the signal outputted by the first and the second analog to digital converters 40 and 41, and determine the coefficient of the equalizers 62 and 63 by using the same. The first and the second ripple-group delay detectors 61 and 64 may be disposed in the receiver. In such case, the gain ripple and group delay characteristics of the first and the second band pass filters 30 and 31 may be measured whenever required so that the variation of the gain ripple and group delay characteristics according to the time lapse and the temperature of the first and the second band pass filters 30 and 31 may be reflected or measured according to prescribed conditions.

For example, the characteristics could be measured periodically upon an action like call initiation or power-on, based on exterior conditions such as temperature, or the like. In addition, the first and the second ripple-group delay detectors 61 and 64 may be disposed outside the receiver of the wireless communication terminal. However, embodiments are not intended to be so limited. For example, the equalizer coefficient can be determined by measuring the gain ripple and group delay characteristics during a manufacturing process, and the coefficient is maintained during a use by a user. Further, other components can form the filter compensation equalizer 60. For example, when an adaptive equalizer is used as the equalizers 62 and 63, the filter compensation equalizer 60 is not required to include the first and the second ripple-group delay detectors 61 and 64.

The first and the second equalizers 62 and 63 can receive the determined coefficient and carry out an equalization according to the coefficient to compensate for the gain ripple characteristic and/or the group delay characteristic of the first and the second band pass filters 30 and 31, for example, when outputting the received signal during normal operations.

Figure 4:
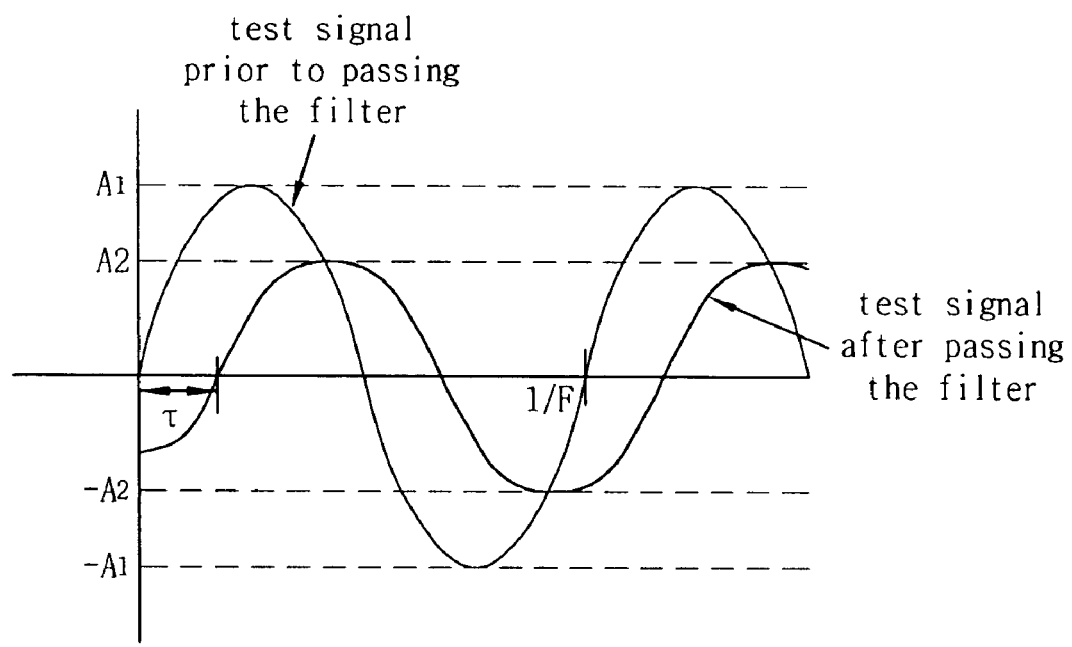
FIG. 4 is a diagram illustrating an example of a test signal prior to passing through a filter and an example of a test signal after passing through the filter.

FIG. 4 is a diagram illustrating an example of a test signal prior to passing through a filter and an example of a test signal after passing through the filter. As shown in FIG. 4, the test signal prior to passing through the filter has an amplitude of 'A1' and a frequency of 'F'. In addition, the test signal after passing through the filter has the frequency of 'F' and an amplitude of 'A2' because of the gain of the filter. The test signal after passing through the filter has a group delay of 'τ' as shown in FIG. 4.

Therefore, the first and the second ripple-group delay detectors 61 and 64 of FIG. 3 may measure a gain A2/A1 and the group delay of 'τ' using the test signal that passed through the filter, and the gain ripple characteristic and the group delay characteristic of the filter may be measured by varying the frequency 'F' of the test signal and measuring the gain and the group delay. However, embodiments are not intended to be limited thereby.

Figure 5:
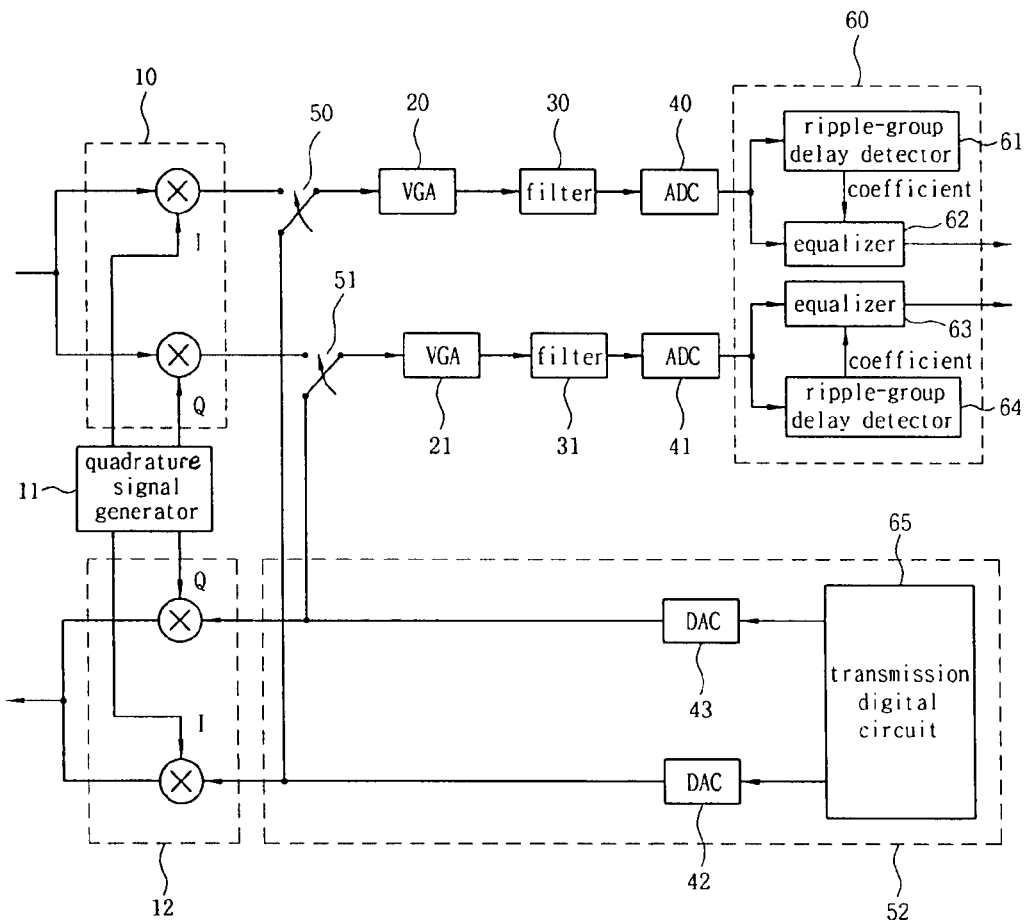
FIG. 5 is a diagram illustrating a receiving circuit configured to compensate for a gain ripple and a group delay characteristics of a filter in accordance with another embodiment of the invention.

FIG. 5 is a diagram illustrating a receiving circuit for compensating for the gain ripple and the group delay characteristics of a filter in accordance with another embodiment of the invention. As shown in FIG. 5, a receiving circuit can include the first and the second variable gain amplifiers 20 and 21 between the first and the second switches 50 and 51 and the first and the second band pass filters 30 and 31, respectively.

Therefore, the gain ripple and the group delay characteristics compensated for by the filter compensation equalizer 60 can include the gain ripple and the group delay characteristics of the first and the second variable gain amplifiers 20 and 21 as well as those of the first and the second band pass filters 30 and 31 since the test signal generated in the test signal generator 52 can be converted to the digital signal after passing through the first and the second variable gain amplifiers 20 and 21 and the first and the second band pass filters 30 and 31, respectively.

In addition, the receiving circuit shown in FIG. 5 includes a portion of a transmission circuit that can be used to generate the test signal (e.g., operate as the test signal generator 52 of FIG. 3). As shown in FIG. 5, the transmission circuit can include a transmission digital circuit 65, first and second DACs 42 and 43 and an IQ mixer 12. A signal outputted by the transmission digital circuit 65 can be transmitted to the first and the second switches 50 and 51 via the first and second DACs 42 and 43.

The transmission digital circuit 65 can generate a test digital signal having a predetermined amplitude and a frequency varying according to time during the test period, and a digital signal corresponding to a transmission signal during the normal operation period (e.g., otherwise). For instance, the digital test signal may include a signal having a frequency that is sequentially increased from a lowest frequency to a highest frequency of a pass band of the first and the second band pass filters 30 and 31 or a signal having a frequency that is sequentially decreased from the highest frequency to the lowest frequency of the pass band of the first and the second band pass filters 30 and 31. However, the test signal is not intended to be so limited according to embodiments of the invention.

The first and second DACs 42 and 43 can convert the test signal generated by the transmission digital circuit 65 to an analog signal to be transmitted to the first and the second switches 50 and 51.

Figure 6:
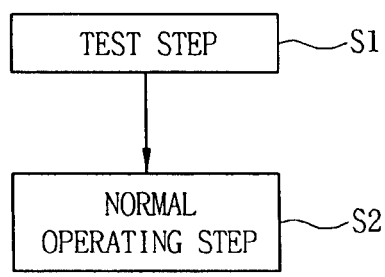
FIG. 6 is a diagram illustrating a method for compensating for a gain ripple and a group delay characteristics of a filter in accordance with an embodiment of the invention.

FIG. 6 is a diagram illustrating a method for compensating for a gain ripple and/or a group delay characteristics of a filter in accordance with an embodiment of the invention. Embodiments with respect to FIG. 6 will be described referring to embodiments of FIGS. 3 and 5, however, the invention is not intended to be so limited thereby.

As sown in FIG. 6, the method can include a test step or process (block S1) where the test signal can be applied to the filter, the corresponding gain ripple and/or the group delay characteristics are measured, and a correction factor such as coefficients of an equalizer can be determined according to the gain ripple and the group delay characteristics. During normal operations (block S2), the gain ripple and the group delay characteristics can be compensated for using the equalizer for which the determined coefficient(s) have been set.

In a test procedure (block S1), the test signal generated in the test signal generator 52 can be applied to the first and the second band pass filters 30 and 31, for example, by an operation of the first and the second switches 50 and 51. The applied test signal is then transmitted to the filter compensation equalizer 60 via the first and the second band pass filters 30 and 31 and in certain embodiments also by the first and the second analog to digital converters 40 and 41 or the first and second VGA 20, 21. Thereafter, the first and the second ripple-group delay detectors 61 and 64 included in the filter compensation equalizer 60 can measure the gain ripple and the group delay characteristics in the transmitted test signal and determine equalizer coefficients. When the first and the second equalizers 62 and 63 are the adaptive equalizers, the first and the second equalizers 62 and 63 can determine equalizer coefficients according to the gain ripple and the group delay characteristics manifested in the transmitted test signal.

As described above, when at least one of the test signal generator 52 and the first and the second ripple-group delay detector 61 and 64 are disposed outside the receiver, the test process (block S1) can be carried out at a prescribed time such as in the manufacturing process. In addition, when all of the test signal generator 52 and the first and the second ripple-group delay detector 61 and 64 are disposed in the receiver, the test process (block S1) may be carried out more than once or whenever required. For instance, the test process (block S1) may be carried out whenever the receiver is turned on. The test process (block S1) may also be carried out when at least one of the temperature and the supply voltage is out of a predetermined range even after the receiver is turned on. For this operation, the receiver may include at least one of a temperature sensor (not shown) and a sensor for measuring a voltage level. However, embodiments are not intended to be so limited. For example, the test process (block S1) can be carried out during one, selected or all periods when there is no signal to be received in case the test process (block S1) is carried out after turning on the receiver. Further, when the transmission circuit is used as the signal generator 52 shown in FIG. 5, such testing (block S1) should be carried out during a period(s) when there are no signals to be received and transmitted.

In normal operations (block S2), the first and the second signal can be applied to the first and the second band pass filters 30 and 31. The signal applied to the first and the second band pass filters 30 and 31 is then transmitted to the filter compensation equalizer 60 via the first and the second band pass filters 30 and 31 and the first and the second analog to digital converters 40 and 41. Thereafter, (e.g., the first and the second equalizers 62 and 63 therein) the filter compensation equalizer 60 can operate according to the equalizer coefficient determined in the test process (block S1) to compensate for the gain ripple and/or the group delay characteristics reflected to the transmitted operational signal.

Embodiments of methods and circuits in accordance with the invention can be advantageous because gain ripple or group delay characteristics may be compensated for in the receiving circuit (e.g., using the equalizer).

In addition, embodiments of methods and circuits in accordance with the invention can be advantageous in that the gain ripple and the group delay characteristics may be reduced to provide an increased design margin for the gain ripple and the group delay characteristics, better signal transmission quality, to improve a performance of a receiver or the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A communication system, comprising:
a first terminal;
a network coupled to the first terminal; and
a second terminal coupled to the network to receive a signal from the first terminal, wherein the second terminal comprises,
an antenna configured to output a received signal from the first terminal;
receiving circuit that comprises,
an IQ mixer configured to output a first signal obtained by combining the received signal with an in-phase signal and a second signal obtained by combining the received signal with a quadrature signal,
a first filter configured to receive a test signal during a first period and the first signal during a second period,
a second filter configured to receive the test signal during the first period and the second signal during the second period,
a test signal generator configured to generate the test signal to detect at least one of a gain ripple characteristic and a group delay characteristic of a filter,
a first ADC configured to receive an output signal from the first filter,
a second ADC configured to receive an output signal from the second filter,
a first filter compensation circuit configured to receive output signals from the first ADC to determine a first coefficient during the first period and compensate for said at least one of the gain ripple characteristic and the group delay characteristic of the first filter by operating according to the first coefficient during the second period, and
a second filter compensation circuit configured to receive output signals from the second ADC to determine a second coefficient during the first period and compensate for said at least one of the gain ripple characteristic and the group delay characteristic of the second filter by operating according to the second coefficient during the second period; and
a transmitting circuit that comprises,
a transmission digital circuit configured to generate a digital signal corresponding to the first signal during the test period and the digital signal corresponding to a transmission signal during a transmission portion of the second period, and
a first DAC and a second DAC configured to convert the digital signals received from the transmission digital circuit to an analog signal and to output the analog signal as the test signal during the first period and the analog signal as an output signal during the transmission portion of the second period, and an additional IQ mixer configured to output a third signal to the antenna obtained by combining the output signal with the in-phase signal and a fourth signal to the antenna obtained by combing the output signal with the quadrature signal wherein the test signal comprises a signal having a frequency that is sequentially increased from a lowest frequency to a highest frequency of a pass band of the first filter and the second filter or the frequency of the signal is sequentially decreased from the highest frequency to the lowest frequency of the pass band of the first filter and the second filter.

2. The circuit in accordance with claim 1, wherein the first filter and the second filter are one of a low pass filter or a band pass filter, and wherein the first period is a test period and the second period is an operational period.

3. The circuit in accordance with claim 1, wherein the first filter compensation circuit comprises:

a first ripple-group delay detector configured to determine the first coefficient by measuring the gain ripple characteristic and the group delay characteristic of the first filter from the signal from the first ADC; and a first filter compensation equalizer configured to compensate for at least one of the gain ripple characteristic and the group delay characteristic of the first filter by operating according to the determined coefficient during the second period.

4. The circuit in accordance with claim 1, wherein the first filter compensation circuit comprises:

a first adaptive equalizer configured to determine the coefficient from the signal from the first ADC, and configured to compensate for at least one of the gain ripple characteristic and the group delay characteristic of both the first filter by operating according to the determined first coefficient during the second period.

5. The circuit in accordance with claim 1, further comprising a first amplifier and a second amplifier respectively disposed between the IQ mixer and the first and the second filters.

6. The circuit in accordance with claim 5, further comprising a quadrature signal generator for applying the in-phase signal and the quadrature signal to the IQ mixer.

7. A receiving circuit, comprising:

an IQ mixer configured to output a first signal and a second signal, the first signal being obtained by multiplying a received signal to an in-phase signal, and the second signal being obtained by multiplying the received signal to a quadrature signal;

a first filter configured to receive a test signal to detect at least one of a gain ripple characteristic and a group delay characteristic of a filter during a first period and the first signal during a second period;

a second filter configured to receive the test signal comprises during the first period and the second signal during the second period, wherein the test signal comprises a signal having a frequency that is sequentially increased from a lowest frequency to a highest frequency of a pass band of the first filter and the second filter or the frequency of the signal is sequentially decreased from the highest frequency to the lowest frequency of the pass band of the first filter and the second filter;

a first ADC configured to receive an output signal of the first filter;

a second ADC configured to receive an output signal of the second filter; and a filter compensation circuit configured to receive an output signal of both the first ADC and the second ADC, wherein the filter compensation equalizer is configured to determine an equalizing coefficient during the first period and configured to compensate at least one of the gain ripple characteristic and the group delay characteristic of the first filter and the second filter by operating according to the equalizing coefficient during the second period.

8. The circuit in accordance with claim 7, comprising:

a first switch coupled between the first filter and the IQ mixer, the first switch configured to apply one of the first signal and the test signal to the first filter; and a second switch coupled between the second filter and the IQ mixer, the second switch configured to apply one of the second signal and the test signal to the second filter.

9. The circuit in accordance with claim 8, comprising:

a first amplifier disposed between the IQ mixer and the first switch; and a second amplifier disposed between the IQ mixer and the second switch.

10. The circuit in accordance with claim 8, comprising:

a first amplifier disposed between the first switch and the first filter; and a second amplifier disposed between the second switch and the second filter.

11. A method for compensating a filter of a receiver circuit, the method comprising:

mixing a received signal to an in-phase signal in a down conversion IQ mixer to output a first signal:

mixing the received signal to a quadrature signal in the IQ mixer to output a second signal;

applying a test signal to a first filter and a second filter during a first period to determine a coefficient of an equalizer according to a respective output of the first filter and the second filter during the first period, wherein the test signal comprises a signal having a frequency sequentially varied to cover each frequency from a lowest frequency to a highest frequency of a pass band of the first and second filter;

applying the first signal to the first filter during a second period and applying the second signal to the second filter during the second period; and respectively applying the first signal to the first filter and the second signal to the second filter while the equalizer compensates a corresponding digital signal converted from the output of the first and second filters for at least one of a gain ripple characteristic and a group delay characteristic of the filters by operating according to the coefficients of the equalizer determined while applying the test signal.

12. The method in accordance with claim 11, wherein the test signal comprises the signal having a frequency sequentially increased from the lowest frequency to the highest frequency of the pass band of the filter or a frequency sequentially decreased from the highest frequency to the lowest frequency of the pass band of the filter.

13. The method in accordance with claim 11, wherein the output of the IQ mixer is amplified and then applied to the filter.

14. The method in accordance with claim 11, wherein said applying the test signal is performed upon enabling the receiving circuit.

15. The method in accordance with claim 11, wherein said applying the test signal is performed when one of a temperature of the receiving circuit and a voltage supplied to the receiving circuit is out of a predetermined range.

16. The circuit in accordance with claim 7, wherein a test signal generator comprises:
   a transmission digital circuit configured to generate a digital signal corresponding to the first signal during the test period and the digital signal corresponding to a transmission signal during a transmission portion of the second period; and
   a first DAC and a second DAC configured to convert the digital signals received from the transmission digital circuit to an analog signal and to output the analog signal as the test signal during the first period and the transmission signal.

17. The circuit in accordance with claim 7, wherein the filter compensation circuit comprises:
   a first filter compensation circuit configured to receive output signals only from the first ADC to determine a first coefficient during the first period and compensate for said at least one of the gain ripple characteristic and the group delay characteristic of the first filter by operating according to the first coefficient during the second period, and
   a second filter compensation circuit configured to receive output signals only from the second ADC to determine a second coefficient during the first period and compensate for said at least one of the gain ripple characteristic and the group delay characteristic of the second filter by operating according to the second coefficient during the second period.

* * * * *